United States Patent [19]

Buchert et al.

[11] Patent Number: 4,942,095
[45] Date of Patent: Jul. 17, 1990

[54] LAMINATE OF POLYMERS STABLE AT HIGH TEMPERATURES AND METAL FOILS APPLIED DIRECTLY TO THE SAID POLYMERS

[75] Inventors: Hermann Buchert, Bad Durkheim; Gerhard Grimm, Altrip; Helmut Muenstedt, Wachenheim, all of Fed. Rep. of Germany

[73] Assignee: BASF Aktiengesellschaft, Ludwigshafen, Fed. Rep. of Germany

[21] Appl. No.: 268,266

[22] Filed: Nov. 7, 1988

[30] Foreign Application Priority Data

Nov. 7, 1987 [DE] Fed. Rep. of Germany ....... 3737922

[51] Int. Cl.$^5$ .................................................. B32B 9/00
[52] U.S. Cl. ................................ 428/461; 428/411.1; 428/457; 428/409; 428/458; 428/460; 428/419; 428/901
[58] Field of Search .............. 428/411.1; 409, 461, 428/457, 458, 460, 419, 901; 156/60, 228, 232, 242, 244.23, 625, 629, 634, 645

[56] References Cited

U.S. PATENT DOCUMENTS 3,855,042 12/1974 Moore ................................ 428/409
4,777,201 10/1988 Shigemoto et al. ................ 428/461

FOREIGN PATENT DOCUMENTS 2942298 4/1981 Fed. Rep. of Germany .

Primary Examiner—Patrick Ryan
Attorney, Agent, or Firm—Oblon, Spivak, McClelland, Maier & Neustadt

[57] ABSTRACT

Laminates are essentially composed of
(A) a thermoplastic which is stable at high temperatures and is based on polyarylethersulfones, polyaryletherketones, polyetherimides or thermotropic polymers and
(B) a metallic foil which is applied directly to the said polymers and whose surface area has been increased by chemical or mechanical treatment,
the side having an increased surface area facing the thermoplastic which is stable at high temperatures, and the adhesion between the metallic foil (B) and the thermoplastic (A) which is stable at high temperatures being not less than 1.9 N/mm, measured at a peeling speed of 20 mm/min and a peeling angle of 180°.

5 Claims, 1 Drawing Sheet

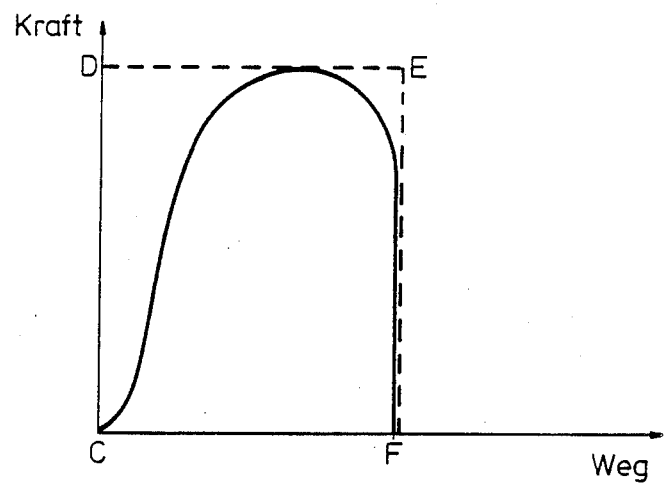

LAMINATE OF POLYMERS STABLE AT HIGH TEMPERATURES AND METAL FOILS APPLIED DIRECTLY TO THE SAID POLYMERS

The present invention relates to laminates essentially composed of
(A) a thermoplastic which is stable at high temperatures and is based on polyarylethersulfones, polyaryletherketones, polyetherimides or thermotropic polymers and
(B) a metallic foil which is applied directly to the said polymers and whose surface area has been increased by chemical or mechanical treatment,
the side having an increased surface area facing the thermoplastic which is stable at high temperatures, and the adhesion between the metallic foil (B) and the thermoplastic (A) which is stable at high temperatures being not less than 1.9 N/mm, measured at a peeling speed of 20 mm/min and a peeling angle of 180°.

The present invention furthermore relates to the use of such laminates as printed circuit boards, and a process for the preparation of the novel laminates.

Substrates based on epoxy resins, to which the printed circuit boards are applied after an etching process, are now the predominant substrates used for the production of printed circuit boards. Since resins of this type cannot be processed by a thermoplastic method, the production of such boards as well as the shaping of the said boards is relatively time-consuming and expensive.

Printed circuit boards based on thermoplastic polymers do not have these disadvantages but problems are encountered in their production. For example, it is difficult to apply the metallic conductor paths to the thermoplastic substrate with sufficient adhesion; moreover, the thermoplastic substrate must also be sufficiently heat-resistant to withstand undamaged the soldering process required during fastening of the components to the printed circuit board.

EP-B No. 63 347 discloses a process for applying electrically conductive copper paths to thermoplastics, in which a copper foil provided with an adhesion-promoting layer is pressed against the thermoplastic with the aid of a heated plate. The plate carries the desired conductor paths in raised form, so that the desired conductor paths are sheared off during the compression process and are adhesively bonded to the substrate by the adhesion-promoting layer arranged between the copper foil and the substrate. Copper foil which is not required is removed with the aid of a support film applied to that side of the copper foil which is opposite the adhesion-promoting layer.

On the one hand, this process requires a copper foil consisting of not less than 3 layers (adhesion-promoting layer, actual copper foil and support film) and, on the other hand, the maximum plate temperatures are limited to 220°–230° C. since both the adhesion-promoting layer and the support film are damaged at higher temperatures.

Furthermore, the adhesion-promoting layer must be matched with each individual thermoplastic; satisfactory results are not obtained with thermoplastics which are stable at high temperatures, such as polyarylethersulfones, polyaryletherketones and polyetherimides.

It is an object of the present invention to provide laminates of thermoplastics stable at high temperatures and metals, which can be prepared in a simple manner and have sufficient adhesion between the metal foil and the thermoplastic.

We have found that this object is achieved, according to the invention, by the laminates defined at the outset.

The novel laminates contain, as component (A), a thermoplastic which is stable at high temperatures and is based on polyarylethersulfones, polyaryletherketones, polyetherimides or thermotropic, i.e. liquid crystalline, polymers.

Mixtures of different polymers of the above-mentioned types, and copolymers consisting of units derived from different monomers which form the individual polymer types, can of course also be used. These copolymers may contain the units in random or block form.

Thermoplastics which are stable at high temperatures and are essentially derived from units of the general formula I and/or II constitute a first preferred group, in which the proportions of units of the formulae I and II can each be 0–100 mol %, i.e. are not subject to any particular restriction,

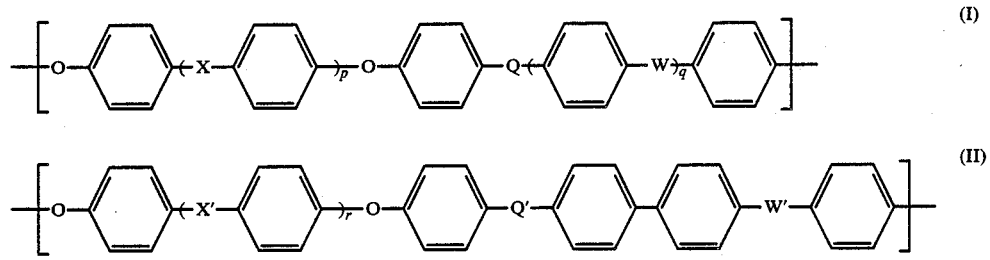

or their $C_1$–$C_6$-alkyl or alkoxy, aryl, chlorine or fluorine derivatives which are substituted in the nucleus, where X, X', Q, Q', W and W' independently of one another may be —$SO_2$—, —O—, —S—, —CO—, a chemical bond or —CRR'—, R and R' are each hydrogen, $C_1$–$C_6$-alkyl or alkoxy, aryl or their fluorine or chlorine derivatives, and p, q and r are each 0 or 1.

Depending on the importance of the substituents X, Q, W, X', Q' and W', this definition covers both polyarylethersulfones and polyaryletherketones and their random or block copolymers.

The following is a group of preferred examples of units of the formulae I and II:

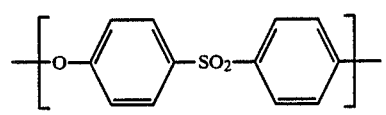 (I1)
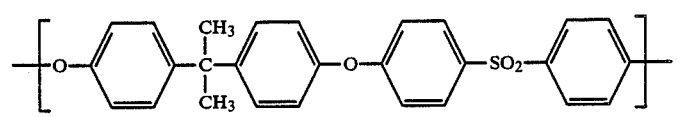 (I2)
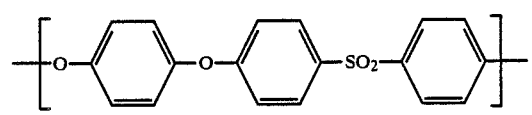 (I3)
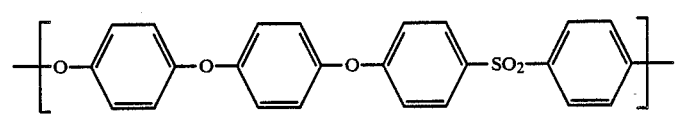 (I4)
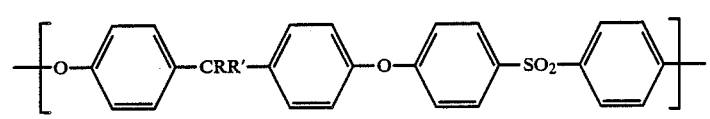 (I5)
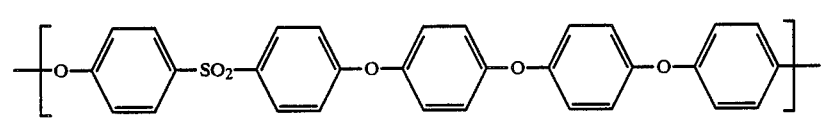 (I6)
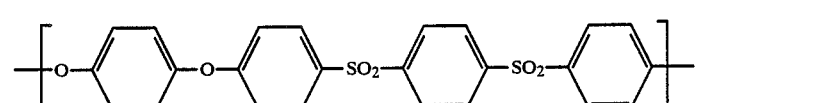 (I7)
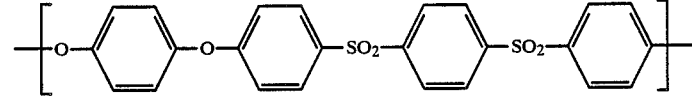 (I8)
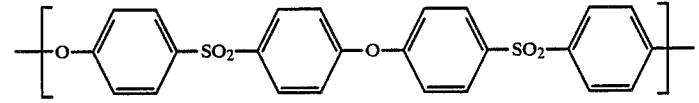 (I9)
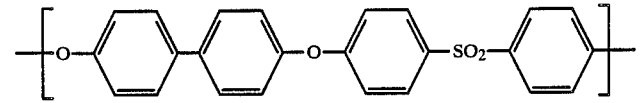 (II1)
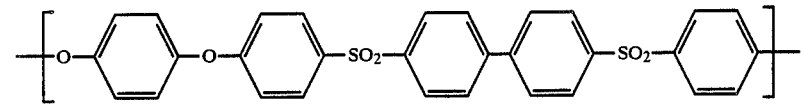 (II2)
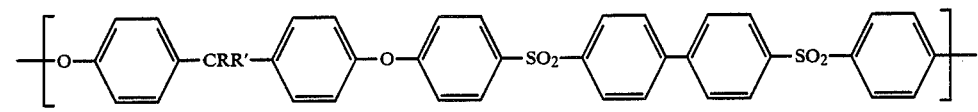 (II3)
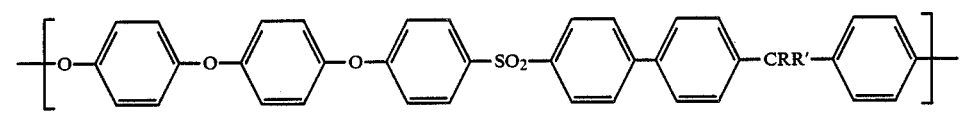 (II4)
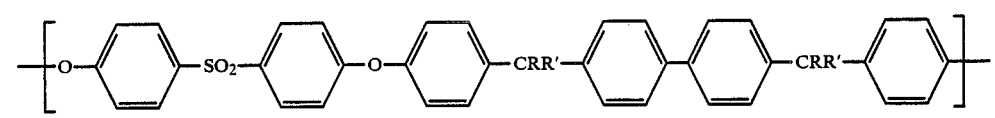
and

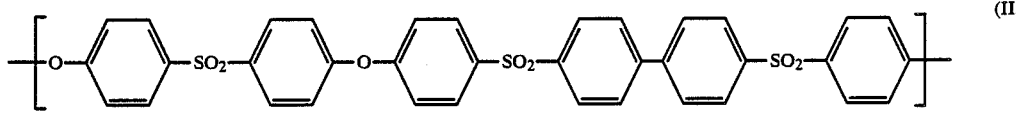

The above Examples can be described as follows in terms of the substituents X, Q, W and X', Q' and W' and the parameters p, q and r:

|     | p | q | X         | Q      | W      |
|-----|---|---|-----------|--------|--------|
| I1  | 1 | 0 | —SO₂—     | —SO₂—  | —      |
| I2  | 1 | 0 | —C(CH₃)₂— | —SO₂—  | —      |
| I3  | 0 | 0 | —         | —SO₂—  | —      |
| I4  | 1 | 0 | —O—       | —SO₂—  | —      |
| I5  | 1 | 0 | —CRR'—    | —SO₂—  | —      |
| I6  | 1 | 1 | —SO₂—     | —O—    | —O—    |
| I7  | 0 | 1 | —         | —SO₂—  | —SO₂—  |
| I8  | 1 | 0 | —SO₂—     | —SO₂—  | —      |
| I9  | 1 | 0 | chem. bond| —SO₂—  | —      |

|     | r | X'     | Q'     | W'     |
|-----|---|--------|--------|--------|
| II1 | 0 | —      | —SO₂—  | —SO₂—  |
| II2 | 1 | —CRR'— | —SO₂—  | —SO₂—  |
| II3 | 1 | —O—    | —SO₂—  | —CRR'— |
| II4 | 1 | —SO₂—  | —CRR'— | —CRR'— |
| II5 | 1 | —SO₂—  | —SO₂—  | —SO₂—  |

Although, as mentioned above, any combinations of the substituents X, Q and W and X', Q' and W' are in principle possible, preferred units are in general those in which Q and W and Q' and W' are identical, since the corresponding monomers are as a rule more readily obtainable.

Particularly preferred components (A) are polyarylethersulfones which have from 50 to 100 mol % of repeating units of the formulae I1, I2 and II5.

As mentioned above, component (A) may also contain a plurality of different units of the general formula I, i.e. it may be a random or block copolymer.

By replacing some or all of the SO₂ groups in the above formulae by CO groups, polyaryletherketones or sulfone/ketone copolymers are obtained. Processes for the preparation of such products are generally known, and further information is therefore unnecessary here.

The number average molecular weight of such polymers is in general from 2,000 to 150,000, preferably from 4,000 to 70,000.

Examples of monomers from which the units of the general formulae I and II can be prepared are

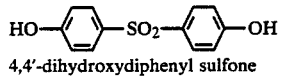
4,4'-dihydroxydiphenyl sulfone

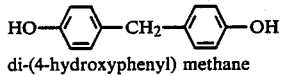
di-(4-hydroxyphenyl) methane

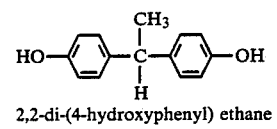
2,2-di-(4-hydroxyphenyl) ethane

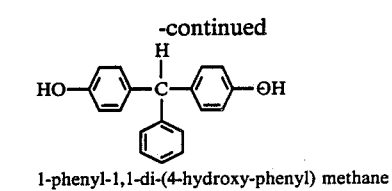
1-phenyl-1,1-di-(4-hydroxy-phenyl) methane

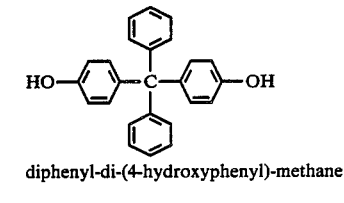
diphenyl-di-(4-hydroxyphenyl)-methane

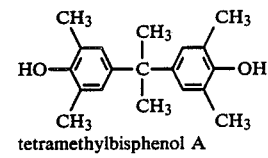
tetramethylbisphenol A

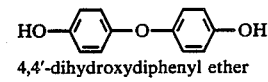
4,4'-dihydroxydiphenyl ether

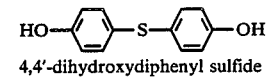
4,4'-dihydroxydiphenyl sulfide

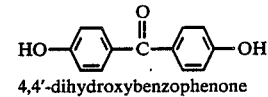
4,4'-dihydroxybenzophenone

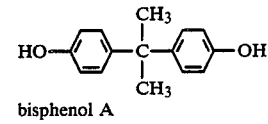
bisphenol A

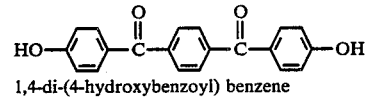
1,4-di-(4-hydroxybenzoyl) benzene

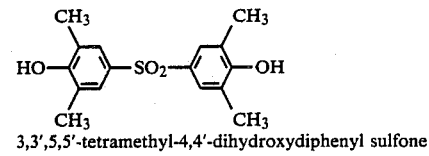
3,3',5,5'-tetramethyl-4,4'-dihydroxydiphenyl sulfone

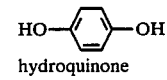
hydroquinone

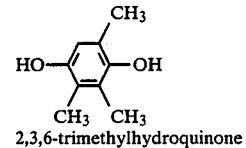
2,3,6-trimethylhydroquinone

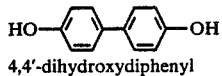
4,4'-dihydroxydiphenyl

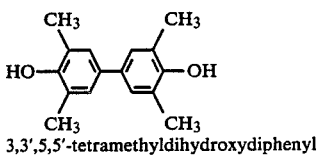
3,3',5,5'-tetramethyldihydroxydiphenyl

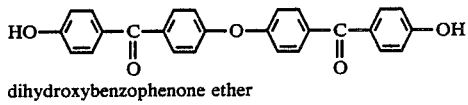
dihydroxybenzophenone ether

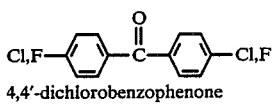
4,4'-dichlorobenzophenone

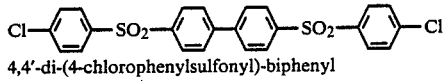
4,4'-di-(4-chlorophenylsulfonyl)-biphenyl

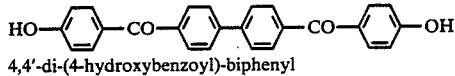
4,4'-di-(4-hydroxybenzoyl)-biphenyl

For some intended uses, it has proven advantageous if the polyarylethersulfones or polyaryletherketones have an alkali metal content of less than 100 ppm. Products of this type are obtainable by appropriate working up methods. Another group of suitable thermoplastics which are stable at high temperatures are polyetherimides which, in addition to ether groups, contain imide structures in the repeating units. Corresponding products are in some cases already available commercially, for example Ultem ® from General Electric Company, which contains the following repeating units:

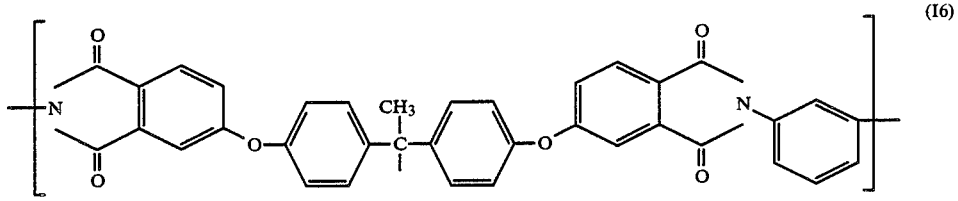
(16)

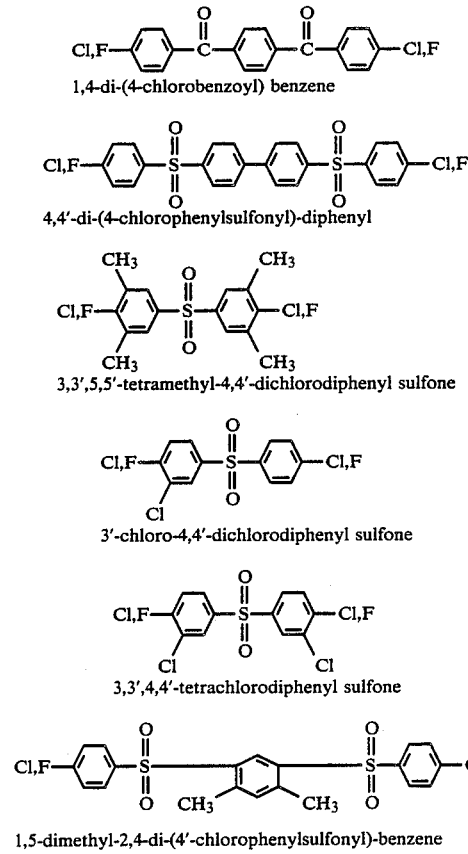

Corresponding products as well as processes for their preparation are described in, for example, U.S. Pat. No. 3,847,867 (corresponding to DE-A No. 23 63 785) and DE-A No. 24 37 286, to which reference may be made for further details.

A final group of thermoplastics (A) which are stable at high temperatures comprises the thermotropic polymers, i.e. polymers which form an anisotropic melt phase. Further data are given in the relevant standard works known in this area, for example A. Blumstein (Ed.), Liquid Crystalline Order in Polymers, to mention but one of these works. Such polymers are also described in a large number of patent applications, and, merely by way of example, reference may be made here to EP-A No. 226 839, EP-A No. 226 078, EP-A No. 225 539, EP-A No. 230 551, EP-A No. 226 847, EP-A No. 230 545, EP-A No. 230 546, EP-A No. 226 080, EP-A No. 227 947, EP-A No. 230 547, EP-A No. 225 537, EP-A No. 225 529, EP-A No. 231 642, EP-A No. 230 550 and EP-A No. 231 468.

The polymers which are stable at high temperatures are used for the preparation of the novel laminates, preferably in the form of sheets or foils having a thickness of 0.03–5 mm. However, other shapes are in principle also possible, provided that the metallic foil can still be applied in a simple manner, preferably using a press tool.

The thermoplastic polymers (A) which are stable at high temperatures can, if required, contain up to 90, preferably 1–60, in particular 2–50, % by weight, based on the total weight of the thermoplastic polymer and filler, of fibrous or particulate fillers, the fillers preferably being insulators or at least poor electrical conductors.

Examples are glass fibers, glass spheres, powdered quartz, wollastonite, chalk (calcium carbonate) and boron nitride.

The novel laminates contain, as component (B), a metal foil which is applied directly (without an adhesion-promoting layer or other adhesion promoters) and which has been treated chemically or mechanically on the side which faces the thermoplastic polymer and thus has an increased surface area.

The mechanical treatment to increase the surface area can be effected, for example, by roughening, by calendering with rolls having a structured surface or by other conventional methods.

Increasing the surface area by chemical treatment can be achieved, for example, by etching the surfaces or by surface oxidation. Suitable etchants or oxidizing agents depend on the type of metal used in the metal foil B and are familiar to the skilled worker, so that further information is unnecessary here.

This one-sided oxidation of the metal foil is important for achieving adhesive strengths between metal and thermoplastic of more than 1.9, preferably more than 1.95, in particular more than 2.0, N/mm.

In addition to the maximum adhesive strength, the uniformity of adhesion of the metal foil (B) to the thermoplastic (A) is also important in practice, i.e. not only should particularly high adhesive strength be achieved at individual points but the metal foil (B) should have good to very good adhesive strengths over a large part of the area over which it is bonded to the thermoplastic.

One possible method of obtaining information about these parameters is described below with reference to the FIGURE.

BRIEF DESCRIPTION OF THE DRAWINGS

The FIGURE shows a force/displacement graph obtained when the force required to peel off the metal foil from the thermoplastic is plotted as a function of the point on the novel laminate at which the force is measured.

PREFERRED EMBODIMENT

For a known peeling width, the maximum of this curve gives the maximum adhesive strength in N/mm, and the area under the curve, which is expressed as a ratio of the total area of the rectangle CDEF, can be used as a measure of the uniformity of adhesion. The point D corresponds to the point of intersection of the tangent to the curve parallel to the x axis with the y axis, and the point E corresponds to the point of intersection of the above straight line with the straight line parallel to the y axis, which is drawn through the point on the x axis at which the peeling force corresponds to 0, i.e. the metal foil has been completely removed from the thermoplastic.

Point C corresponds to the origin of the selected coordinate system and point F corresponds to the point of intersection of the force/displacement curve with the x axis, i.e. F is the point at which the metal foil has been completely removed.

It can be seen that the ideal case occurs when the area under the measured force/displacement curve is identical to that of the rectangle CDEF, and that the uniformity of adhesion is better the greater the ratio of the area under the force/displacement curve to the area of the rectangle CDEF.

In the case of the novel laminates, this ratio is preferably not less than 0.6 or 60%, in particular not less than 0.7 (70%), particularly preferably from 0.70 to 0.95.

Because of its good chemical stability and its good conductivity, the metal used is preferably copper, which is preferably employed in the form of foils oxidized on one side, as available commercially. The thickness of these foils is in general from 5 to 500 $\mu$m, preferably from 8 to 350 $\mu$m, in particular from 12 to 250 $\mu$m. Foil thicknesses of 15-50 $\mu$m have proven particularly suitable to date.

The foil is applied to the polymer stable at high temperatures preferably by means of a press tool, various conditions (temperature of the press tool, pressure during compression) having proven advantageous, depending on the thermoplastic polymer used.

A preferred process developed as part of the invention is described in detail below.

In the novel process, a metal foil oxidized on one side is applied by means of a press tool to a substrate consisting of a thermoplastic polymer which is stable at high temperatures, the temperature of the press tool being from 15° to 60° C., preferably from 20° to 50° C., in particular from 25° to 40° C., above the glass transition temperature of the thermoplastic, and the oxidized side of the foil being bonded to the thermoplastic; if the temperature is outside this range, insufficient adhesive strengths are obtained (at temperatures which are too low) or deformation of the substrate (bubble formation at excessively high temperatures) and, associated with this, likewise a deterioration in the adhesive strength are observed.

The pressure during the compression process is in general from 50 kPa (0.5 bar) to 2 MPa (20 bar), the optimum values depending on the substrate used and on the temperature of the press tool. The pressure is preferably 100–1,000, in particular 200–800, kPa.

The duration of the compression process is likewise variable and is in general from 3 to 240, preferably from 5 to 120, in particular from 10 to 60, sec, once again depending on the type of substrate, on the compressive pressure and on the surface temperature of the tool.

Compared with the known processes, the novel process has in particular the advantage that the use of an adhesive for applying the metal foil, with all the associated problems, can be dispensed with without adversely affecting the adhesive strength.

Moreover, the thermoplastic substrate need no longer be heated; the heat introduced through the elevated temperature of the press tool is sufficient.

The novel process can be used both to produce thermoplastics which are laminated with metal over the entire surface and directly to produce printed circuit boards. In the former case, the press tool used can be any ram; in the latter case, it is preferable to use plates on which the conductor paths are provided in raised form.

The novel process can be used to produce laminates having an adhesive strength (between metallic foil and thermoplastic substrate) of more than 1.9, in particular more than 1.95, particularly preferably from 1.9 to 2.5, N/mm.

Although not entirely substantiated, initial findings indicate that the oxidation and the associated increase in the surface area of the metal foil, in conjunction with the optimum temperature/pressure combination, are responsible for the excellent adhesive strengths. Because of their good properties, the novel laminates are particularly suitable as printed circuit boards in the electrical and electronic sector, as well as for the production of metal-laminated shaped articles very generally.

EXAMPLES

A copper foil oxidized on one side and having a thickness of 35 μm was laminated with a 1.6 mm thick sheet of a polyethersulfone having repeating units of the formula

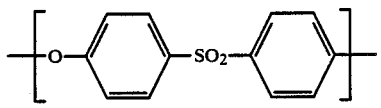

(Ultrason ® E 2000 from BASF AG, glass transition temperature 226° C.) using a ram under a pressure of 500 kPa and a surface temperature of 230°–270° C. during a compression time of 20 sec.

The adhesive strength of the resulting materials was determined at a peeling speed of 20 mm/min and a peeling angle of 180°.

The ratio of the area under the force/displacement curve thus determined to the area of the rectangle CDEF as defined in the FIGURE is likewise stated.

In the Examples 10–16, the polyethersulfone contained 20% by weight of glass fibers.

TABLE

| Example No. | Temp. of press tool °C. | Max. adhesive strength N/mm | Ratio of areas (%) |
|---|---|---|---|
| 1 | 230 | 1.9 | 37.1 |
| 2 | 235 | 1.9 | 51.7 |
| 3 | 240 | 1.9 | 48.2 |
| 4 | 245 | 1.9 | 68.3 |
| 5 | 250 | 1.95 | 86.9 |
| 6 | 255 | 2.0 | 86.8 |
| 7 | 260 | 2.0 | 85.9 |
| 8 | 265 | 1.95 | 82.8 |
| 9 | 270 | 1.95 | 74.6 |
| 10 | 230 | 1.9 | 39.6 |
| 11 | 235 | 1.92 | 58.3 |
| 12 | 240 | 1.9 | 63.5 |
| 13 | 245 | 1.95 | 70.9 |
| 14 | 250 | 1.95 | 68.0 |
| 15 | 255 | 1.98 | 79.5 |
| 16 | 260 | 2.0 | 86.0 |

It can be seen that, by compression at 15°–45° C. above the glass transition temperature of the thermoplastic, particularly advantageous results are obtained, particularly with regard to the uniformity of adhesive strength. At the maximum adhesive strength, the dependence on the press temperature is not so pronounced.

We claim:

1. A laminate essentially composed of:
   (A) a thermoplastic which is stable at high temperatures and is derived from a material selected from the group consisting of polyarylethersulfones, polyaryletherketones, polyetherimides and thermotropic polymers and
   (B) a metallic foil which is applied directly to said polymers and whose surface area has been increased by chemical or mechanical treatment,
   the side having an increased surface area facing the thermoplastic which is stable at high temperatures, and the adhesion between the metallic foil (B) and the thermoplastic (A) which is stable at high temperatures being not less than 1.9 N/mm, measured at a peeling speed of 20 mm/min and a peeling angle of 180°, wherein said thermoplastic has a number average molecular weight of 2,000 to 150,000.

2. A laminate as claimed in claim 1, wherein the metallic foil B is a copper foil.

3. A laminate as claimed in claim 1, wherein the thermoplastic (A) which is stable at high temperatures is composed of:
   from 0 to 100 mol % of units of the formula I

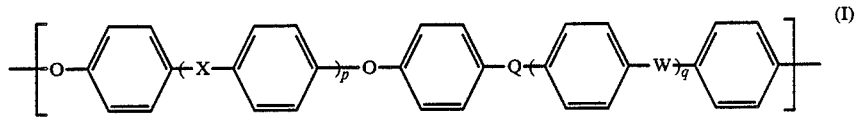

and/or
   from 0 to 100 mol % of units of the formula

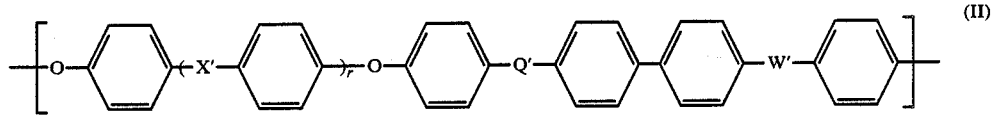

or their $C_1$–$C_6$-alkyl or alkoxy, aryl, chlorine or fluorine derivatives which are substituted in the nucleus, where X, X', Q, Q', W and W' independently of one another are each —$SO_2$—, —O—, —S— or —CO—, a chemical bond or —CRR'—, R and R' are each hydrogen, $C_1$–$C_6$-alkyl or alkoxy, aryl or their fluorine or chlorine derivatives, and p, q and r are each 0 or 1, wherein the sum of the amounts of said units of formula I and said units of formula II equals 100 mole %.

4. A laminate as claimed in claim 1, wherein the thermoplastic polymer (A) further contains up to 90% by weight of a filler based on the total weight of the thermoplastic polymer and filler, said filler being selected from the group consisting of a fibrous filler, a particulate filler and mixtures thereof.

5. A process for the preparation of a laminate of a thermoplastic polymer stable at high temperatures and a metal foil, wherein a metal foil having a surface area which has been increased on one side by chemical or mechanical treatment is laminated on this side with the thermoplastic using a press under from 50 kPa to 2 MPa and during a compression time of 3–240 sec, the temperature of the press tool being from 15° to 60° C. above the glass transition temperature of the said thermoplastic (A), wherein said thermoplastic polymer has a number average molecular weight of 2,000 to 150,000.

* * * * *